United States Patent
Zhu et al.

(10) Patent No.: US 9,958,884 B1
(45) Date of Patent: May 1, 2018

(54) UNIVERSAL ADAPTIVE VOLTAGE SCALING SYSTEM

(71) Applicant: Marvell International Ltd., Hamilton (BM)

(72) Inventors: Jun Zhu, San Jose, CA (US); Liping Guo, Palo Alto, CA (US); Joseph Jun Cao, Los Gatos, CA (US)

(73) Assignee: Marvell International Ltd., Hamilton (BM)

(*) Notice: Subject to any disclaimer, the term of this patent is extended or adjusted under 35 U.S.C. 154(b) by 0 days. days.

(21) Appl. No.: 14/954,833

(22) Filed: Nov. 30, 2015

Related U.S. Application Data

(63) Continuation of application No. 14/012,878, filed on Aug. 28, 2013, now Pat. No. 9,223,327.

(60) Provisional application No. 61/732,622, filed on Dec. 3, 2012, provisional application No. 61/729,910, filed on Nov. 26, 2012.

(51) Int. Cl.
| | |
|---|---|
| G06F 1/00 | (2006.01) |
| G06F 1/32 | (2006.01) |
| G05F 3/02 | (2006.01) |
| G05F 1/10 | (2006.01) |
| H03K 3/011 | (2006.01) |
| H03K 3/012 | (2006.01) |

(52) U.S. Cl.
CPC .............. *G05F 1/10* (2013.01); *G06F 1/3203* (2013.01); *H03K 3/011* (2013.01); *H03K 3/012* (2013.01)

(58) Field of Classification Search
CPC ....................................................... G06F 1/3203
USPC ......................................................... 713/300
See application file for complete search history.

(56) References Cited

U.S. PATENT DOCUMENTS

| | | | | |
|---|---|---|---|---|
| 6,157,247 | A * | 12/2000 | Abdesselem | G06F 1/3203 327/158 |
| 6,868,503 | B1 | 3/2005 | Maksimovic et al. | |
| 6,885,610 | B2 * | 4/2005 | Takayanagi | G11C 5/02 365/189.02 |
| 6,924,679 | B2 * | 8/2005 | Seno | G06F 1/10 327/158 |
| 6,971,079 | B2 * | 11/2005 | Yee | G06F 17/5031 716/113 |
| 7,061,292 | B2 | 6/2006 | Maksimovic et al. | |
| 7,248,091 | B2 * | 7/2007 | Chung | H03L 7/0812 327/158 |
| 7,417,482 | B2 * | 8/2008 | Elgebaly | G06F 1/3203 327/278 |
| 7,581,120 | B1 | 8/2009 | Hartman et al. | |
| 7,659,772 | B2 * | 2/2010 | Nomura | H03K 19/0008 327/534 |

(Continued)

OTHER PUBLICATIONS

Wirnshofer et al., "Adaptive Voltage Scaling by In-Situ Delay Monitoring for an Image Processing Circuit", IEEE 2012, 4 pages.

(Continued)

*Primary Examiner* — Suresh Suryawanshi

(57) ABSTRACT

A method includes, in at least one aspect, determining a relative delay of a signal path with respect to a timing budget; determining that the signal path is active; determining a value of a voltage being supplied to the signal path; and causing an adjustment in the voltage being supplied to the signal path based on the relative delay, the signal path being active, and the value of the voltage being supplied to the signal path.

28 Claims, 5 Drawing Sheets

(56) References Cited

U.S. PATENT DOCUMENTS

| | | | |
|---|---|---|---|
| 8,004,348 B2 * | 8/2011 | Ikenaga | H03K 19/00384 327/540 |
| 8,046,601 B1 | 10/2011 | Paz et al. | |
| 8,362,642 B2 * | 1/2013 | Zerbe | G06F 1/26 307/43 |
| 8,368,457 B2 * | 2/2013 | Ikenaga | G06F 1/3203 327/530 |
| 8,378,738 B1 | 2/2013 | Zhu et al. | |
| 8,405,413 B2 * | 3/2013 | Carpenter | G01R 31/31725 324/750.3 |
| 8,661,274 B2 | 2/2014 | Hansquine et al. | |
| 8,725,488 B2 * | 5/2014 | Hofmann | G06F 1/3203 703/23 |
| 8,797,095 B2 | 8/2014 | Moore et al. | |
| 9,444,440 B2 * | 9/2016 | Jain | H03K 5/1534 |
| 2013/0041608 A1 * | 2/2013 | Charlebois | G06F 17/5031 702/79 |
| 2014/0028364 A1 | 1/2014 | Venkatraman et al. | |

OTHER PUBLICATIONS

Eireiner et al., "In-Situ Delay Characterization and Local Supply Voltage Adjustment for Compensation of Local Parametric Variations", IEEE Journal of Solid-State Circuits, vol. 42, No. 7, Jul. 2007, pp. 1583-1592.

Wirnshofer et al., "A Variation-Aware Adaptive Voltage Scaling Technique based on In-Situ Delay Monitoring", IEEE 2011, 6 pages.

* cited by examiner

UNIVERSAL ADAPTIVE VOLTAGE SCALING SYSTEM

CROSS REFERENCE TO RELATED APPLICATIONS

This disclosure is a continuation and claims the benefit of priority under 35 U.S.C. § 120 of U.S. application Ser. No. 14/012,878, filed on Aug. 28, 2013, which claims the benefit of priority under 35 U.S.C. § 119(e) of U.S. Provisional Application No. 61/732,622, filed Dec. 3, 2012, and U.S. Provisional Application No. 61/729,910, filed Nov. 26, 2012, the disclosures of which are hereby incorporated by reference in their entirety.

FIELD OF USE

The present disclosure relates to voltage scaling.

BACKGROUND

Adaptive voltage scaling may be used on system-on-a-chip (SOC) designs to save dynamic power and leakage power. Process, power supply voltage level, and temperature (PVT) corners may cause variation in timing for paths of an integrated circuit (IC) chip. For example, the delay for a NAND gate in a worst case scenario (e.g., slowest PVT corner) may be several times more than that in a best case scenario (e.g., fastest PVT corner).

Adaptive voltage scaling may be used to improve the power consumption on the IC. Adaptive voltage scaling may be used to apply a minimum power supply voltage that is required to meet critical path timing in a PVT corner for the chip. For example, if the critical path timing delay is determined as being unnecessarily fast, the power supply voltage may be lowered to increase the critical path timing delay. Lowering the power supply voltage increases the delay to bring the real critical path timing closer to the desired timing budget or margin. Also, by lowering the voltage, power may be saved. In another example, if the real critical path delay is determined as being greater than the desired timing budget, then the power supply voltage can be increased to decrease the critical path delay to bring the delay closer to the desired timing budget.

SUMMARY

The present disclosure describes systems and techniques relating to voltage scaling. In general, in one aspect, a system includes a universal adaptive voltage scaling monitor, a transition detector, and an adaptive voltage scaling controller. The universal adaptive voltage scaling monitor configured to receive a first signal generated by a signal path, delay the first signal by an adjustable time period, receive a second signal associated with the signal path, compare the delayed first signal and the second signal, provide an error signal indicating a result of the comparison, where the error signal is asserted when the result of the comparison indicates that the delayed first signal is different from the second signal, and maintain the asserted error signal until an asserted reset signal is received. The transition detector is configured to detect a transition in the second signal, and provide a transition signal, where the transition signal is asserted in response to detecting the transition in the second signal. The adaptive voltage scaling controller is configured to determine a voltage being provided to the signal path, receive the error signal from the universal adaptive voltage scaling monitor, receive the transition signal from the transition detector, when the received error signal is an asserted error signal, the received transition signal is an asserted transition signal, and the voltage is less than a maximum voltage, provide a first control signal indicating that the voltage is to be increased, and when the received error signal is an unasserted error signal, the received transition signal is an asserted transition signal, and the voltage is greater than a minimum voltage, provide a second control signal indicating that the voltage is to be decreased.

The described systems and techniques can be implemented so as to realize one or more of the following advantages. The adaptive voltage scaling system may be used to monitor delays of and scale a voltage supplied to multiple critical paths in different power domains and different clock domains. The adaptive voltage scaling monitor is a universal monitor that may be used for any signal path, independent of the path, the clock domain associated with the path, and the power domain associated with the path. The universal adaptive voltage scaling monitor can be implemented in early design stage, such as the register-transfer level (RTL) stage, and can be positioned at the end of a critical path to determine a delay in the path.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

Details of one or more implementations are set forth in the accompanying drawings and the description below. Other features, objects, and advantages may be apparent from the description and drawings, and from the claims.

DETAILED DESCRIPTION

Figure 1:
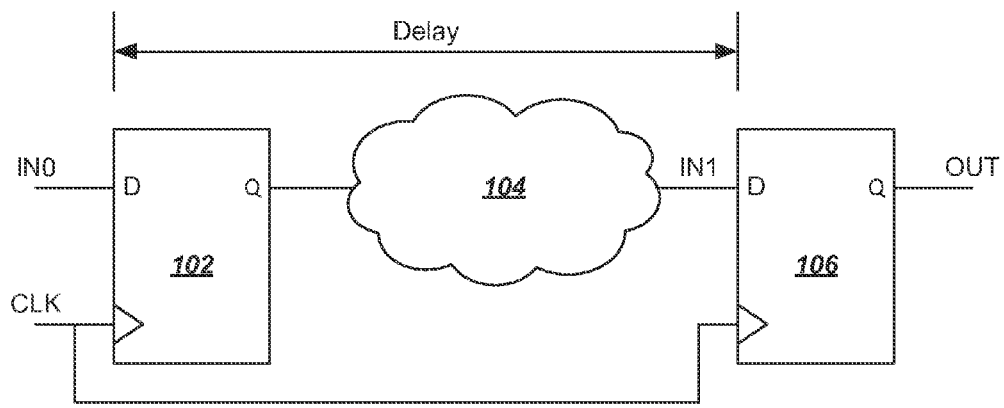
FIG. 1 is a block diagram showing an example of a critical path.

FIG. 1 is a block diagram showing an example of a critical path. The critical path includes a flip flop 102, combinational logic 104, and a flip-flop 106. A CLK signal is provided to the flip-flop 102 and the flip-flop 106. The flip-flop 102 receives a signal IN0 and provides a signal to combinational logic 104. Combinational logic 104 receives the signal provided by the flip-flop 102 and outputs a signal IN1. The flip-flop 106 receives the signal IN1 and outputs a signal OUT. The delay from IN0 being received by the flip-flop 102 and IN1 being received by the flip-flop 106 represents the delay of a critical path between the flip-flop 102 and the flip-flop 106.

Figure 2:
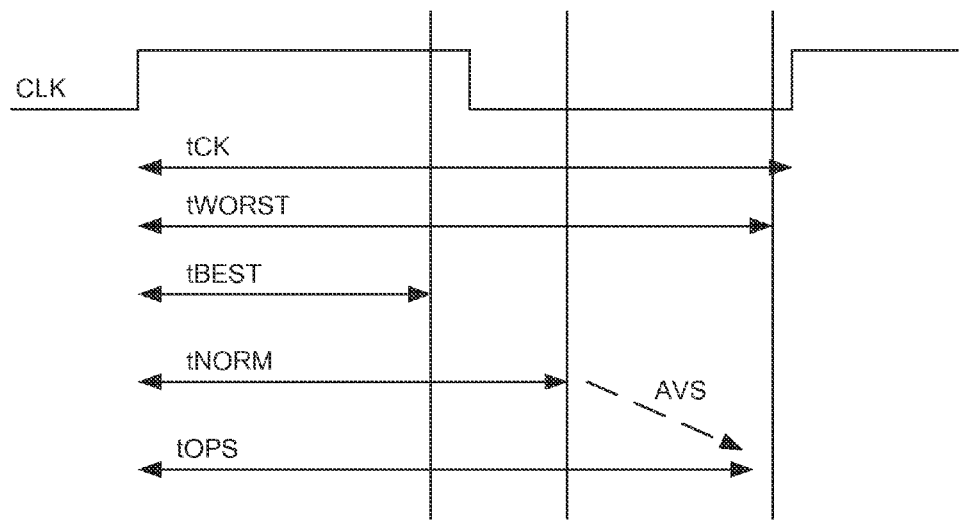
FIG. 2 is a diagram showing examples of delays of a critical path.

FIG. 2 is a diagram showing examples of delays of a critical path relative to a CLK signal supplied to the critical path. The delays may correspond to different operation scenarios. The time tCK is a clock period of the clock signal supplied to the flip-flops of the critical path. The delays for all the different operation scenarios should be less than the time tCK, taking into account clock uncertainties, such as skew and jitter. Delay tWORST represents the delay of the critical path in the worst case scenario. The worst case scenario may be associated with high temperature and low voltage. Delay tBEST represents the delay in the best case scenario. The best case scenario may be associated with low temperature and high voltage. Delay tNORM represents the delay in a normal case scenario. Delay tOPS represents a target delay to be achieved by adaptive voltage scaling (AVS). Power savings may increase as the time difference between delay tOPS and delay tWORST decreases.

Figure 3:
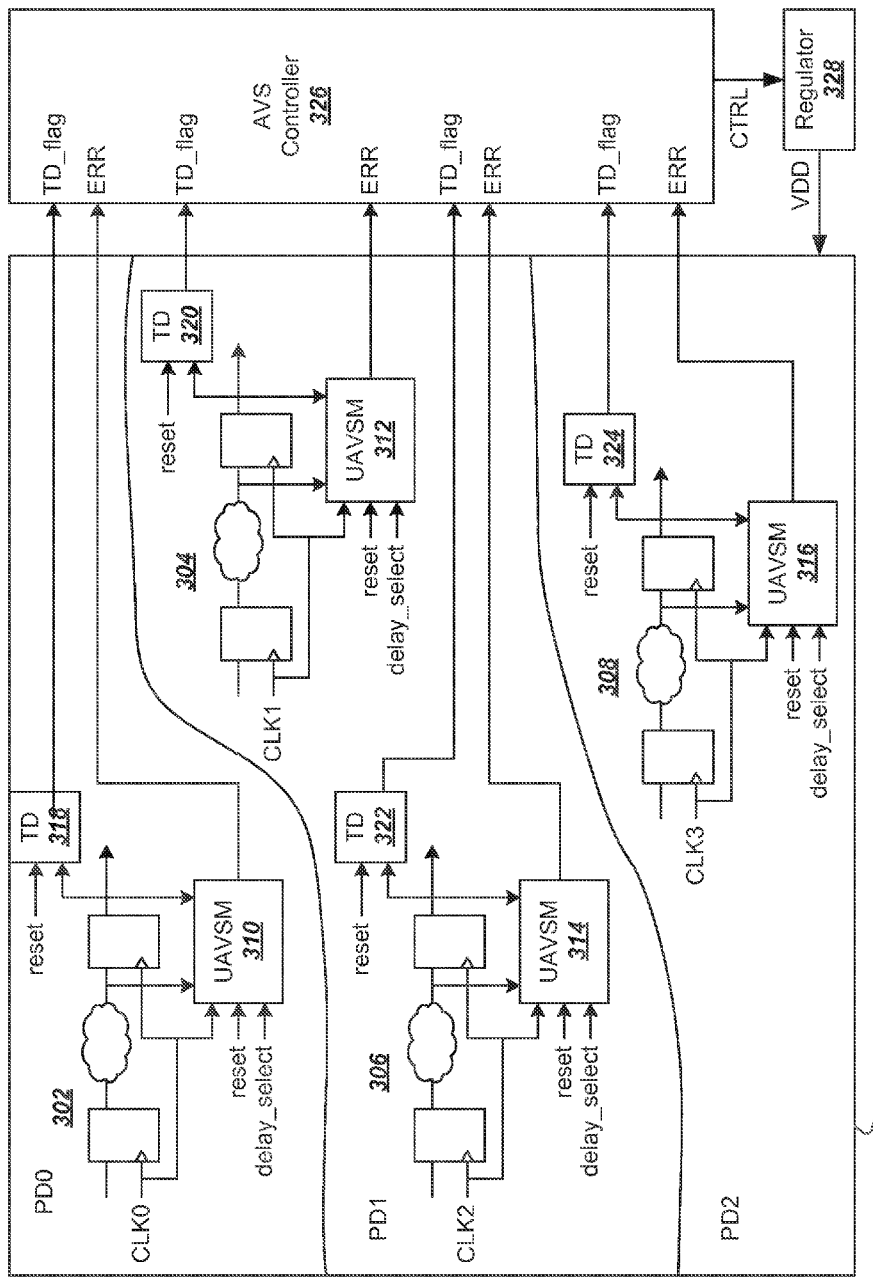
FIG. 3 is a block diagram showing an example of an adaptive voltage scaling system.

FIG. 3 is a diagram showing an example of an adaptive voltage scaling (AVS) system. The AVS system is implemented in one voltage domain V0 corresponding to voltage VDD in SOC 300. The SOC 300 includes three power domains PD0, PD1, and PD2 in voltage domain V0. The SOC 300 includes four identified critical paths 302, 304, 306, and 308. The path 302 is in power domain PD0 and in a clock domain CLK0. The path 304 is in power domain PD1 and in clock domain CLK1. The path 306 is in power domain PD1 and in clock domain CLK2. The path 308 is in power domain PD2 and in clock domain CLK3.

The AVS system includes four universal adaptive voltage scaling monitors (UAVSMs) 310, 312, 314, and 316, which are implemented to monitor critical paths 302, 304, 306, and 308, respectively. Each UAVSM monitors the delay of the respective critical path and provides an ERR signal indicating whether the delay of the respective critical path is above or below a timing budget. If the delay is below the timing budget, the delay is in a safe window and the ERR signal is unasserted, e.g., ERR=0. If the delay is above the timing budget, the delay is in a danger window and the ERR signal is asserted, e.g., ERR=1. The ERR signal is unasserted, e.g., clamped at 0, when power of the respective power domain is off.

Each UAVSM receives a delay_select signal. The delay_select signal controls the timing budget of the UAVSM. The timing budget of each UAVSM is programmable independently of the timing budgets of the other UAVSMs. For example, a UAVSM in the AVS system may have a timing budget that is different from another UAVSM in the AVS system.

The AVS system includes four transition or toggle detectors (TDs) 318, 320, 322, and 324, which are implemented to detect a transition in the output of critical paths 302, 304, 306, and 308, respectively. Each TD detects a toggle or transition in the output signal of the respective critical path. Each TD provides a TD_flag signal. The TD_flag signal indicates whether the output signal of the respective critical path toggled or transitioned during a monitoring period. The TD_flag signal is asserted, e.g., TD_flag=1, when the output signal being monitored toggles, and remains asserted until an asserted reset signal is received. The TD_flag signal is unasserted, e.g., TD_flag=0, when the asserted reset signal is received. The TD_flag is unasserted, e.g., clamped at 0, when power in the corresponding power domain is off.

The AVS system includes an adaptive voltage scaling (AVS) controller 326. The AVS controller 326 may be implemented in a power domain that is always powered on to perform adaptive voltage scaling. The AVS controller 326 may be a centralized module. The AVS controller 326 interfaces with the UAVSMs 310, 312, 314, and 316 and the TDs 318, 320, 322, and 324. The AVS controller 326 collects and maintains information associated with each power domain, e.g., whether the power domain is on, information associated with each UAVSM 310, 312, 314, and 316, e.g., whether the UAVSM is enabled and the ERR signal, and information associated with each transition detector 318, 320, 322, and 324, e.g, the TD_flag signal. The AVS controller 326 maintains information associated with the voltage supplied to the SOC 300, such as the current voltage being supplied to the SOC 300, and a voltage range, e.g., a minimum voltage and a maximum voltage, corresponding to proper operation of the SOC 300. Based on the collected information, the AVS controller 326 determines whether to scale the voltage VDD supplied to the SOC 300. The AVS controller 326 generates control signals CTRL based on the collected information. The AVS controller 326 may generate an interrupt to notify the system of a potentially dangerous operating scenario, such as a delay in a critical path that is greater than a worst case delay for the critical path even though the supply voltage has reached a maximum voltage for the SOC 300.

The AVS system includes voltage regulator 328. The voltage regulator generates the scalable supply voltage VDD for voltage domain V0. The voltage regulator 328 may be controlled by the AVS controller 326. The AVS controller 326 sends the control signals CTRL to the voltage regulator 328 to control the voltage VDD for voltage domain V0.

The AVS controller 326 may send an asserted reset signal at the beginning of a monitoring period to the UAVSMs 310, 312, 314, and 316, and the TDs 318, 320, 322, and 324 to reset the states of the UAVSMs and TDs. The asserted reset signal clears the bits of or unasserts the TD_flag signals and the ERR signals.

Figure 4:
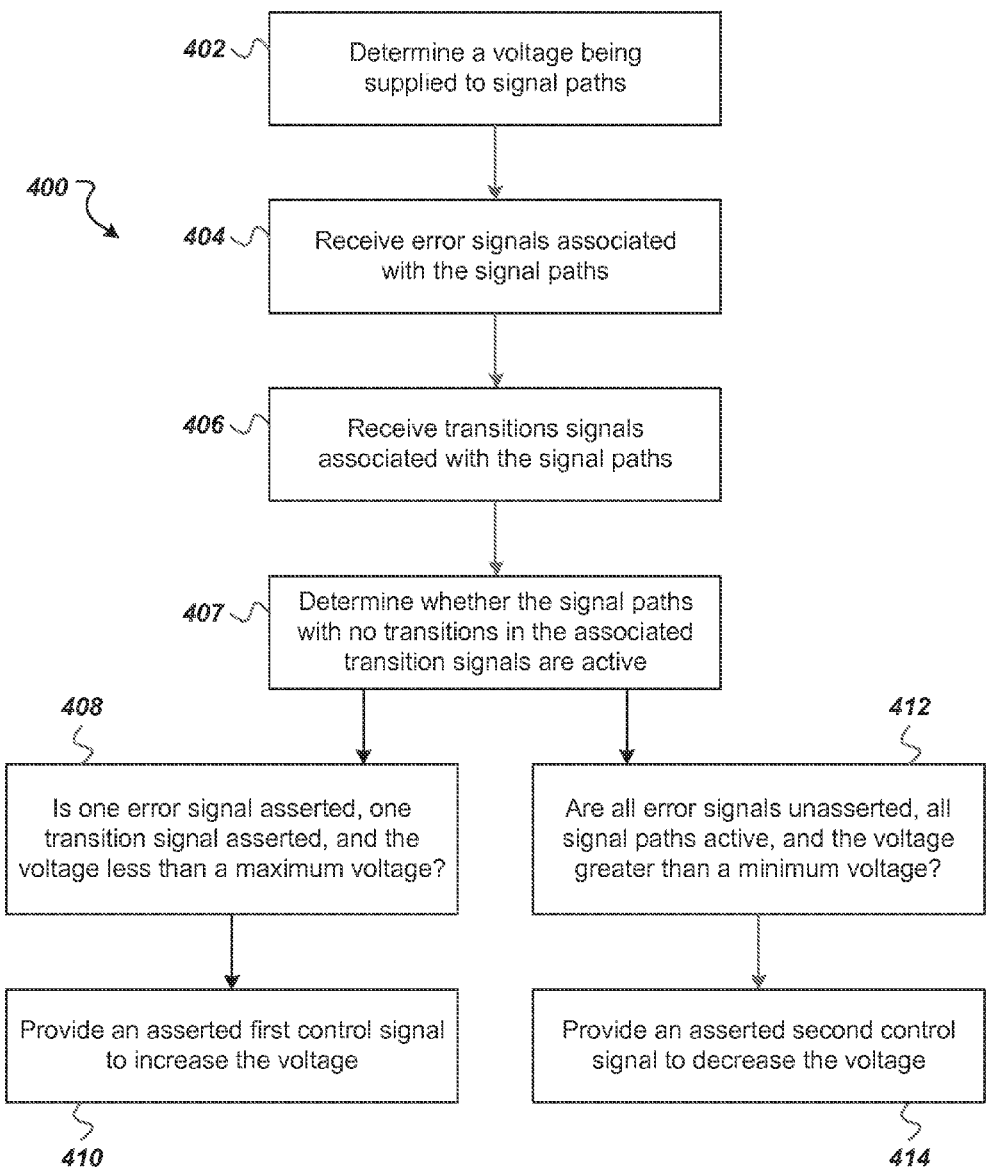
FIG. 4 is a flowchart showing examples of operations performed by an adaptive voltage scaling controller.

FIG. 4 is a flowchart showing examples of operations 400 performed by an AVS controller, e.g., the AVS controller 326 of FIG. 3. The operations 400 may be performed by program code, hardware, or a combination of program code and hardware implemented in a data processing apparatus. Briefly, the adaptive voltage scaling controller performs operations that include determining a voltage being supplied to the signal paths (402), receiving error signals associated with the signal paths (404), receiving transition signals associated with the signal paths (406), and determining whether the signal paths with no transitions in the associated transition signals are active (407). When at least one error signal is an asserted error signal, at least one transition signal is an asserted transition signal, and the voltage is less than a maximum voltage (408), the adaptive voltage scaling controller asserts a first control signal and provides the asserted first control signal to increase the voltage (410). When all error signals are unasserted error signals, all signal paths are active, and the voltage is greater than a minimum voltage (412), the adaptive voltage scaling controller asserts a second control signal and provides the asserted second control signal indicating that the voltage is to be decreased (414).

An example of an algorithm performed by the AVS controller 326 of FIG. 3 is presented below. For each power domain PD0, PD1, PD2, and PD3, the AVS controller maintains a register bit PD_on[*] that indicates whether the power domain is on. The AVS controller maintains registers ERR[3:0] for the UAVSMs. For each UAVSM 310, 312, 314, and 316, the AVS controller maintains a register bit UAVSM_en[*] that indicates whether the UAVSM is enabled and the signal path is active. The AVS controller may disable a UAVSM when the AVS controller determines that a signal path is inactive. For each UAVSM 310, 312, 314, and 316, the AVS controller maintains a register bit ERR[*] that indicates whether the delay of the corresponding critical path is in the danger window (e.g., ERR[*]=1) or the safe window (e.g., ERR[*]=0). When ERR[*] is 1, the AVS controller asserts a register bit danger[*] indicating that a delay of a path is within a danger window. The AVS controller maintains registers TD_flag[3:0] for the TDs. For each TD, the AVS controller maintains a register bit TD_flag[*] that indicates whether the output of the corresponding critical path toggled. The AVS controller counts the number of times a TD_flag[*] is asserted and stores this number in TD_cnt[*]. The AVS controller monitors the above signals for a time period indicated by a monitoring window size WIN_SIZE.

```
While(1) {
  /*init*/
  configure delay_select[*];
init:
  danger[*]=0; TD_cnt[*]=0;
  /*test N windows, each window is WIN_SIZE clock cycle long*/
  for (i=0; i<N; i++) {
    /*reset and start a evaluation window*/
    reset=1; reset=0;
    /*wait for WIN_SIZE cyc*/
    for (t=0; t<WIN_SIZE; t++);
    /*evaluate the results of UAVSM*/
    for (ii=0; ii<3; ii++) {
      if ((ERR[ii] == 1) & (PD_on[ii] == 1) &
        (TD_flag[ii] == 1) & (UAVSM_en[ii] == 1))
          danger[ii] = 1;
      if (TD_flag[ii])
        TD_cnt[ii]++;
    } /*for ii*/
    /*check danger: if danger, jump out of the loop, inc volt*/
    if (danger[*]) goto increase_voltage;
  } /*for i*/
  /*check the activity of paths*/
  for (j=0; j<3; j++) {
    if (TD_cnt[j] == 0 & UAVSM_en[j] == 1 & PD_on[j] == 1) {
      signal system to check the reason why the path[j] is not
        toggling for N windows;
      if path[j] is inactive, set UAVSM[j]_en to 0;
    }
  }
  /*analyze results and adjust voltage*/
  /*no danger happen to all active UAVSMs*/
  if ((TD_cnt[*] != 0 & UAVSM_en[*] == 1 & PD_on[*] == 1) &
    (current_voltage > minimun_voltage))
      decrease current_voltage by one step;
  goto init;
increase_voltage:
  if (current_voltage == maximum_voltage)
    interrupt system to report the danger;
  else
    increase current_voltage by one step;
  goto init;
}/*while*/
```

Figure 5:
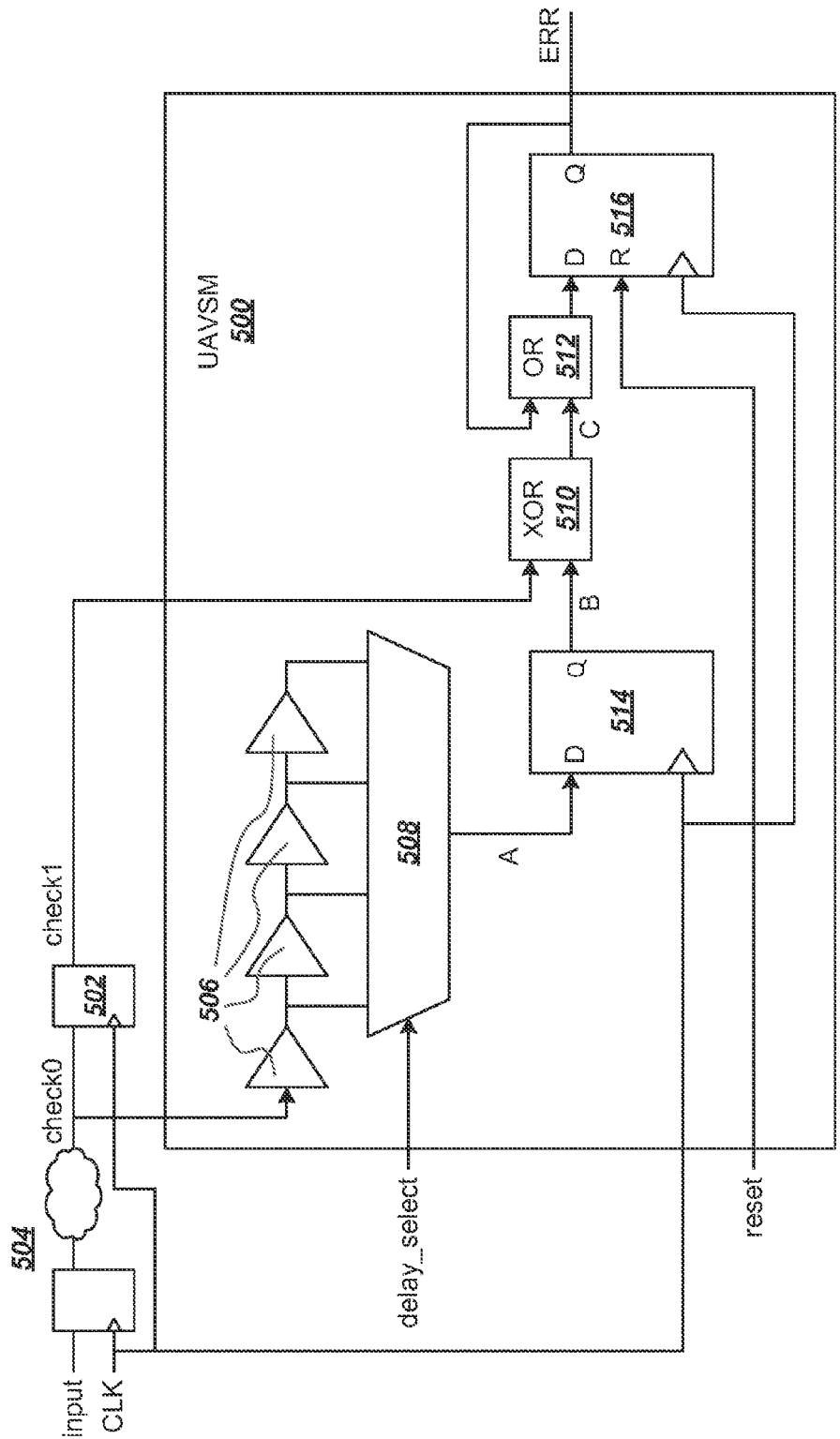
FIG. 5 is a block diagram showing an example of an adaptive voltage scaling monitor.

FIG. 5 is a diagram showing an example of a UAVSM 500. The UAVSM 500 may be implemented in a SOC, e.g., SOC 300 of FIG. 3. The UAVSM 500 is a universal monitor that may be used for any signal path, independent of the path, the clock domain associated with the path, and the power domain associated with the path. The UAVSM 500 can be implemented in early design stage, such as the register-transfer level (RTL) stage, and can be positioned at the end of a critical path to determine a delay in the path.

The UAVSM 500 is connected with a capturing flip-flop 502 of a critical path 504 being monitored. The UAVSM 500 receives signal check0 and signal check1 of the critical path 504. The signal check0 is the input signal to the flip-flop 502. The signal check1 is the output signal of the flip-flop 502. The UAVSM 500 receives a clock signal CLK, which is the clock signal used by the critical path 504. The UAVSM 500 receives a reset signal that, when asserted, resets the ERR signal provided by the UAVSM 500.

The UAVSM includes a delay line that receives the signal check0 generated by the critical path 504 and delays the signal check0 by an adjustable time period. The delay line includes delay circuits 506 and a multiplexer 508. The multiplexer 508 receives a delay_select signal that programs the delay of the delay line to adjust the timing budget, e.g., sizes of the safe window and the danger window, of the critical path. The delay of the delay line can be selected to be, for example, 2% to 15% of the clock period in the worst operation scenario. The multiplexer 508 provides a signal A, corresponding to a delayed version of the signal check0, in accordance with the delay_select signal. A flip-flop 514 stores the signal A for a clock cycle.

The UAVSM 500 includes a two-input XOR gate 510. The XOR gate 510 receives signal check1 associated with the signal path 504 and the signal B, which is a delayed version of the signal check0, from the flip-flop 514. The XOR gate 510 compares the signal B and the signal check1, and provides a signal C indicating a result of the comparison.

The UAVSM 500 includes a holding circuitry that maintains an asserted ERR signal, when the result of the comparison indicates that the signal B is different from the signal check1, until an asserted reset signal is received. The holding circuitry may include, for example, a two-input OR gate 512 and a flip-flop 516. The OR gate 512 and the flip-flop 516 maintains an asserted C signal and outputs the C signal as the ERR signal. For example, when the ERR signal is 1, the flip-flop 516 maintains the ERR signal at 1 until an asserted reset signal is received. The flip-flop 516 receives a reset signal that, when asserted, resets the ERR signal. The flip-flop 516 may be used to handle any possible metastability issue associated with flip-flop 514.

The UAVSM 500 monitors the critical path 504 during a monitoring window. The monitoring window is a period of time of monitoring, which can be specified in nanoseconds or a number of clock cycles. When the monitoring window starts, a reset signal is applied to the UAVSM 500 to reset the ERR signal. During the monitoring window, the UAVMS 500 monitors the delay of the path 504.

Figure 6:
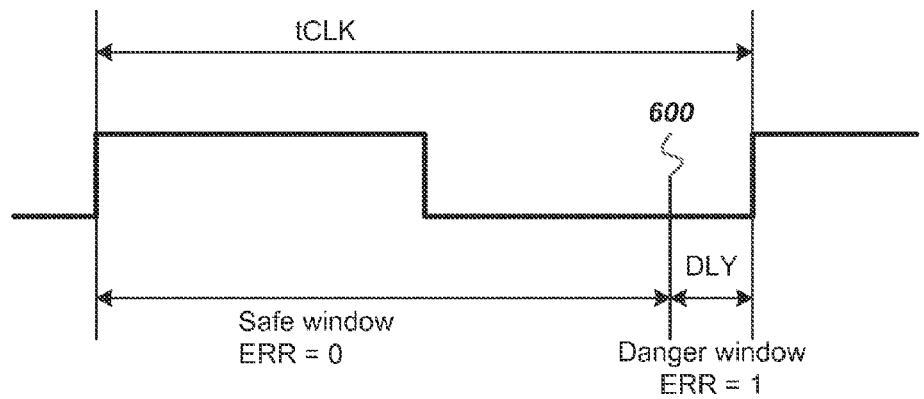
FIG. 6 is a diagram showing an example of a timing budget for a critical path.

FIG. 6 is a diagram showing an example of a timing budget 600 for a critical path for a clock cycle tCLK. When the delay of the critical path falls into the safe window, e.g., ERR=0, the voltage may be decreased to increase the delay to bring the delay closer to the desired timing budget 600. When the delay falls into the danger window, e.g., ERR=1, the voltage should be increased to decrease the delay to bring the delay below the desired timing budget 600. The programmable delay DLY of the delay line of the UAVSM defines the danger window size, and defines the timing budget 600 of the critical path.

Figure 7:
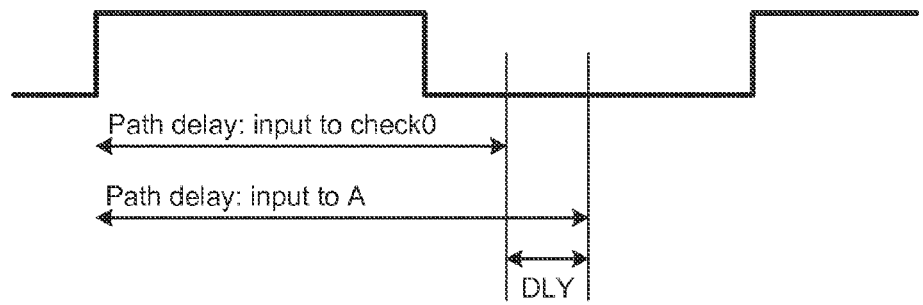
FIG. 7 is a diagram showing an example of a delay of a critical path within a safe window.

FIG. 7 is a diagram showing an example of a delay from the input signal to the check0 signal of the critical path 504 of FIG. 5 within the safe window shown in FIG. 6. When the input signal of the critical path 504 toggles and if the path delay from the input signal of the critical path 504 to the signal A is smaller than a clock cycle tCLK, flip-flop 514 and flip-flop 516 latch the same data, and the UAVSM outputs a 0 on the ERR signal line.

Figure 8:
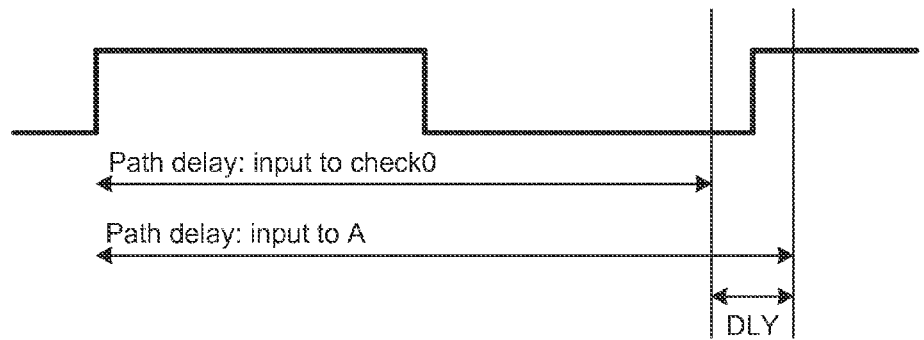
FIG. 8 is a diagram showing an example of a delay of a critical path within a danger window.

FIG. 8 is a diagram showing an example of a delay from the input signal to the check0 signal of the critical path 504 of FIG. 5 within the danger window shown in FIG. 6. When the input signal of the critical path 504 toggles and if the path delay from the input signal of the critical path 504 to the signal A is larger than a clock cycle tCLK, flip-flop 514 and flip-flop 516 latch different data, and the UAVSM outputs a 1 on the ERR signal line.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including system on chip (SoC) implementations.

While this specification contains many specifics, these should not be construed as limitations on the scope of what may be claimed, but rather as descriptions of features that may be specific to particular embodiments. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations. Other implementations fall within the scope of the following claims.

What is claimed is:

1. A method comprising:
   determining a relative delay of a signal path with respect to a timing budget;
   determining that the signal path is active, wherein the determining that the signal path is active comprises determining whether a transition occurred in a signal provided by the signal path;
   determining a value of a voltage being supplied to a domain associated with the signal path; and
   causing an adjustment in the voltage being supplied to the domain associated with the signal path based on the relative delay, the signal path being active, and the value of the voltage being supplied to the domain associated with the signal path,
   wherein determining the relative delay of the signal path with respect to the timing budget comprises:
   generating a delayed version of a first signal provided by the signal path in accordance with the timing budget; and
   comparing a second signal provided by the signal path to the delayed version of the first signal.

2. The method of claim 1, wherein the timing budget is a programmable timing budget, and generating the delayed version of the first signal comprises:
   generating a plurality of delayed versions of the first signal; and
   selecting one of the plurality of delayed versions of the first signal in accordance with the programmable timing budget.

3. The method of claim 1, wherein determining that the signal path is active comprises:
   determining that the transition occurred in the signal provided by the signal path.

4. The method of claim 1, wherein determining that the signal path is active comprises:
   determining that no transition occurred in the signal provided by the signal path; and
   in response to determining that no transition occurred in the signal provided by the signal path, determining that power of a power domain associated with the signal path is on.

5. The method of claim 1, wherein causing the adjustment in the voltage being supplied to the domain associated with the signal path comprises:
   causing an increase in the voltage being supplied to the domain associated with the signal path when the relative delay of the signal path is greater than the timing budget, the signal path is active, and the value of the voltage being supplied to the domain associated with the signal path is less than a maximum voltage.

6. The method of claim 1, wherein causing the adjustment in the voltage being supplied to the domain associated with the signal path comprises:
   causing a decrease in the voltage being supplied to the domain associated with the signal path when the relative delay of the signal path is less than the timing budget, the signal path is active, and the value of the voltage being supplied to the domain associated with the signal path is greater than a minimum voltage.

7. The method of claim 1, wherein the signal path is a first signal path, the timing budget is a first timing budget, the domain is associated with the first signal path and a second signal path, and the method further comprises:
   determining a relative delay of the second signal path with respect to a second timing budget; and
   determining that the second signal path is active,
   wherein causing the adjustment of the voltage being supplied to the domain associated with the first signal path comprises causing the adjustment of the voltage being supplied to the domain associated with the first signal path and the second signal path based on at least one of the relative delay of the first signal path or the relative delay of the second signal path, at least one of the first signal path being active or the second signal path being active, and the value of the voltage being supplied to the domain associated with the first signal path and the second signal path.

8. The method of claim 7, wherein causing the adjustment of the voltage being supplied to the domain associated with the first signal path and the second signal path comprises:
   causing an increase in the voltage being supplied to the domain associated with the first signal path and the second signal path when (i) at least one of the relative delay of the first signal path is greater than the first timing budget or the relative delay of the second signal path is greater than the second timing budget, (ii) at least one of the first signal path is active or the second signal path is active, and (iii) the value of the voltage being supplied to the domain associated with the first signal path and the second signal path is less than a maximum voltage.

9. The method of claim 7, wherein causing the adjustment in the voltage being supplied to the domain associated with the first signal path and the second signal path comprises:
    causing a decrease in the voltage being supplied to the domain associated with the first signal path and the second signal path when the relative delay of the first signal path is less than the first timing budget, the relative delay of the second signal path is less than the second timing budget, the first signal path is active, the second signal path is active, and the value of the voltage being supplied to the domain associated with the first signal path and the second signal path is greater than a minimum voltage.

10. The method of claim 7, wherein the first timing budget is different from the second timing budget.

11. The method of claim 7, wherein the first signal path and the second signal path are in different power domains.

12. The method of claim 7, wherein the first signal path and the second signal path are in different clock domains.

13. The method of claim 1, further comprising one or more of:
    maintaining a signal indicating the relative delay of the signal path until after the causing of the adjustment in the voltage being supplied to the domain associated with the signal path; or
    maintaining a signal indicating the signal path being active until after the causing of the adjustment in the voltage being supplied to the domain associated with the signal path.

14. An apparatus comprising:
    circuitry to determine a relative delay of a signal path with respect to a timing budget;
    circuitry to determine that the signal path is active, wherein the circuitry to determine that the signal path is active comprises circuitry to determine whether a transition occurred in a signal provided by the signal path;
    circuitry to determine a value of a voltage being supplied to a domain associated with the signal path; and
    circuitry to cause an adjustment in the voltage being supplied to the domain associated with the signal path based on the relative delay, the signal path being active, and the value of the voltage being supplied to the domain associated with the signal path,
    wherein the circuitry to determine the relative delay of the signal path with respect to the timing budget comprises:
        circuitry to generate a delayed version of a first signal provided by the signal path in accordance with the timing budget; and
        circuitry to compare a second signal provided by the signal path to the delayed version of the first signal.

15. The apparatus of claim 14, wherein the timing budget is a programmable timing budget, and the circuitry to generate the delayed version of the first signal comprises:
    circuitry to generate a plurality of delayed versions of the first signal; and
    circuitry to select one of the plurality of delayed versions of the first signal in accordance with the programmable timing budget.

16. The apparatus of claim 14, wherein the circuitry to determine that the signal path is active further comprises:
    circuitry to determine, in response to a determination that no transition occurred in the signal provided by the signal path, that power of a power domain associated with the signal path is on.

17. The apparatus of claim 14, wherein the circuitry to cause the adjustment in the voltage being supplied to the domain associated with the signal path comprises:
    circuitry to cause an increase in the voltage being supplied to the domain associated with the signal path when the relative delay of the signal path is greater than the timing budget, the signal path is active, and the value of the voltage being supplied to the domain associated with the signal path is less than a maximum voltage.

18. The apparatus of claim 14, wherein the circuitry to cause the adjustment in the voltage being supplied to the domain associated with the signal path comprises:
    circuitry to cause a decrease in the voltage being supplied to the domain associated with the signal path when the relative delay of the signal path is less than the timing budget, the signal path is active, and the value of the voltage being supplied to the domain associated with the signal path is greater than a minimum voltage.

19. An apparatus comprising:
    circuitry to determine a relative delay of a signal path with respect to a timing budget;
    circuitry to determine that the signal path is active, wherein the circuitry to determine that the signal path is active comprises circuitry to determine whether a transition occurred in a signal provided by the signal path;
    circuitry to determine a value of a voltage being supplied to a domain associated with the signal path; and
    circuitry to cause an adjustment in the voltage being supplied to the domain associated with the signal path based on the relative delay, the signal path being active, and the value of the voltage being supplied to the domain associated with the signal path,
    wherein the signal path is a first signal path, the timing budget is a first timing budget, the domain is associated with the first signal path and a second signal path, and the apparatus further comprises:
    circuitry to determine a relative delay of the second signal path with respect to a second timing budget; and
    circuitry to determine that the second signal path is active,
    wherein the circuitry to cause the adjustment of the voltage being supplied to the domain associated with the first signal path comprises circuitry to cause the adjustment of the voltage being supplied to the domain associated with the first signal path and the second signal path based on at least one of the relative delay of the first signal path or the relative delay of the second signal path, at least one of the first signal path being active or the second signal path being active, and the value of the voltage being supplied to the domain associated with the first signal path and the second signal path.

20. The apparatus of claim 19, wherein the circuitry to cause the adjustment of the voltage being supplied to the domain associated with the first signal path and the second signal path comprises:
    circuitry to cause an increase in the voltage being supplied to the domain associated with the first signal path and the second signal path when (i) at least one of the relative delay of the first signal path is greater than the first timing budget or the relative delay of the second signal path is greater than the second timing budget, (ii) at least one of the first signal path is active or the second signal path is active, and (iii) the value of the voltage being supplied to the domain associated with the first signal path and the second signal path is less than a maximum voltage.

21. The apparatus of claim 19, wherein the circuitry to cause the adjustment in the voltage being supplied to the domain associated with the first signal path and the second signal path comprises:
   circuitry to cause a decrease in the voltage being supplied to the domain associated with the first signal path and the second signal path when the relative delay of the first signal path is less than the first timing budget, the relative delay of the second signal path is less than the second timing budget, the first signal path is active, the second signal path is active, and the value of the voltage being supplied to the domain associated with the first signal path and the second signal path is greater than a minimum voltage.

22. The apparatus of claim 19, wherein the first timing budget is different from the second timing budget.

23. The apparatus of claim 19, wherein the first signal path and the second signal path are in different power domains.

24. The apparatus of claim 19, wherein the first signal path and the second signal path are in different clock domains.

25. The apparatus of claim 14, further comprising one or more of:
   circuitry to maintain a signal indicating the relative delay of the signal path until after the causing of the adjustment in the voltage being supplied to the domain associated with the signal path; or
   circuitry to maintain a signal indicating the signal path being active until after the causing of the adjustment in the voltage being supplied to the domain associated with the signal path.

26. The apparatus of claim 19, wherein the circuitry to determine the relative delay of the first signal path with respect to the first timing budget comprises:
   circuitry to generate a delayed version of a first signal provided by the first signal path in accordance with the first timing budget; and
   circuitry to compare a second signal provided by the first signal path to the delayed version of the first signal provided by the first signal path.

27. The apparatus of claim 19, wherein the circuitry to determine that the first signal path is active further comprises:
   circuitry to determine, in response to a determination that no transition occurred in the signal provided by the first signal path, that power of a power domain associated with the first signal path is on.

28. The apparatus of claim 19, further comprising one or more of:
   circuitry to maintain a signal indicating the relative delay of the first signal path until after the causing of the adjustment in the voltage being supplied to the domain associated with the first signal path and the second signal path; or
   circuitry to maintain a signal indicating the first signal path being active until after the causing of the adjustment in the voltage being supplied to the domain associated with the first signal path and the second signal path.

\* \* \* \* \*